US009888605B2

(12) United States Patent
Xu et al.

(10) Patent No.: US 9,888,605 B2
(45) Date of Patent: Feb. 6, 2018

(54) ELECTRONIC DEVICE

(71) Applicants: INVENTEC TECHNOLOGY CO., LTD, Minhang District, Shanghai (CN); INVENTEC CORPORATION, Shilin District, Taibei (TW)

(72) Inventors: Jipeng Xu, Shanghai (CN); Jiabin Wang, Shanghai (CN); Hui Zhu, Shanghai (CN)

(73) Assignees: INVENTEC TECHNOLOGY CO., LTD, Shanghai (CN); INVENTEC CORPORATION, Taibei (CN)

( * ) Notice: Subject to any disclaimer, the term of this patent is extended or adjusted under 35 U.S.C. 154(b) by 0 days.

(21) Appl. No.: 15/097,613

(22) Filed: Apr. 13, 2016

(65) Prior Publication Data

US 2017/0150633 A1 May 25, 2017

(30) Foreign Application Priority Data

Nov. 24, 2015 (CN) .......................... 2015 1 0827314

(51) Int. Cl.
H05K 7/20 (2006.01)
H05K 7/14 (2006.01)
H01R 12/73 (2011.01)

(52) U.S. Cl.
CPC ......... *H05K 7/1457* (2013.01); *H01R 12/737* (2013.01); *H05K 7/20909* (2013.01)

(58) Field of Classification Search
CPC . H05K 7/1457; H05K 7/20909; H01R 12/737
USPC ................................................ 361/678, 695
See application file for complete search history.

(56) References Cited

U.S. PATENT DOCUMENTS

| 6,747,878 B1* | 6/2004 | Hipp | G06F 1/183 361/679.4 |
|---|---|---|---|
| 7,481,704 B2* | 1/2009 | Kao | F04D 25/0613 361/695 |
| 7,864,523 B2* | 1/2011 | Iwakiri | H05K 7/20727 361/679.46 |
| 2008/0239665 A1* | 10/2008 | Franz | F04D 29/646 361/695 |
| 2011/0194245 A1* | 8/2011 | Wu | G06F 1/184 361/679.48 |
| 2011/0222227 A1* | 9/2011 | Xu | G06F 1/181 361/679.4 |
| 2016/0183402 A1* | 6/2016 | Tamarkin | H04L 49/30 361/679.4 |

* cited by examiner

Primary Examiner — Dion R Ferguson
Assistant Examiner — Mandeep S Buttar
(74) Attorney, Agent, or Firm — Oliff PLC

(57) ABSTRACT

The invention provides an electronic device. By reasonably and tidily arranging modules such as a mainboard, a fan module, a power supply module and a board card module in a case, more modules can be arranged in a limited space of the case, the utilization rate is high and the cost is low; the fan module, the power supply module and the board card module are independently designed and all modules cooperatively work with one another; each module is a clamping structure and can be disassembled and assembled with bare hands, and the operation and maintenance efficiency is improved; and signal transmission between all modules is completed by golden fingers and thereby the internal portion of the case is clean and tidy.

11 Claims, 5 Drawing Sheets

ELECTRONIC DEVICE

BACKGROUND OF THE INVENTION

Field of Invention

The invention relates to an electronic device, in particular to an electronic device of a high-density structural design.

Description of Related Arts

With the development of the communication industry, the requirements on the structural design of communication devices, especially the high-density design of the devices, become higher. In order to realize more functions, very many electronic modules are arranged in cases of the existing communication devices. Therefore, it becomes a direction of communication device development to reasonably and tidily arrange more modules in limited spaces in order to improve the cost performance of products and bring better experience to users.

SUMMARY OF THE INVENTION

In view of the disadvantages of the prior art, the purpose of the invention is to provide an electronic device, which solves the problem that more electronic modules cannot be reasonably and tidily arranged in limited device spaces in the prior art.

In order to realize the above-mentioned and other related purposes, the invention provides an electronic device, which comprises a case comprising two side walls and a bottom base connecting with the two side walls, the case having a first end along a direction of the two side walls and a second end opposite to the first end, the case having a first accommodating space close to the first end, the case being provided with a second accommodating space and a third accommodating space close to the second end; a mainboard fixed on the bottom base, arranged in the second accommodating space and comprising an input/output module for inputting/outputting a signal, the input/output module transmitting the signal to an external electronic device by means of the mainboard, the mainboard having a first plugging portion towards the first accommodating space, a second plugging portion towards the second end and a third plugging portion towards the third accommodating space; at least one fan module disposed in the second accommodating space, having a fan assembling portion and electrically connected with the second plugging portion of the mainboard pluggably; and at least one power supply module disposed in the third accommodating space, having a power supply assembling portion and electrically connected with the third plugging portion of the mainboard pluggably, wherein the power supply module supplies power of the electronic device and the fan module dissipates a heat source of the electronic device.

In one embodiment of the invention, the first plugging portion and the third plugging portion of the mainboard are respectively a golden finger which is electrically connected with a socket in a matching manner.

In one embodiment of the invention, the electronic device further comprises a board card module, which is disposed in the first accommodating space, has a board card assembling portion and is electrically connected with the first plugging portion of the mainboard pluggably.

In one embodiment of the invention, the board card module has a board card backboard, a baseboard management board card and a plurality of network node board cards, wherein the baseboard management board card and the plurality of network node board cards are electrically connected with the mainboard through the board card backboard.

In one embodiment of the invention, the baseboard management board card and the network node board cards respectively have a connector, the board card backboard has a pluggable connector, wherein the connector is electrically connected with the pluggable connector pluggably.

In one embodiment of the invention, the baseboard management board card is only pluggable at a first position during arrangement in an accommodating manner; and the network node board cards are only pluggable at a second position during arrangement in an accommodating manner.

In one embodiment of the invention, the plurality of network node board cards comprise twenty-four network node board cards, and a circuit board of each network node board card is configured with two node board card processor chips.

In one embodiment of the invention, the mainboard is a network switching board and is configured with two network switching chips, the two network switching chips are processor chips which are redundant with each other.

In one embodiment of the invention, the fan module comprises a frame and a fan which is arranged in the frame, the fan module is clamped with or separated from a clamping hole of the electronic device through a clamping tongue of a rotating handle to realize plugging between the second plugging portion and the fan assembling portion.

In one embodiment of the invention, the electronic device comprises two power supply modules, one of the two power supply modules is a power supply module which provides redundancy.

In one embodiment of the invention, the first accommodating space and the third accommodating space are frame structures which are formed on the case.

As described above, in the electronic device provided by the invention, by reasonably and tidily arranging modules such as the mainboard, the fan module, the power supply module and the board card module in the case, more modules can be arranged in the limited space of the case, the utilization rate is high and the cost is low; the fan module, the power supply module and the board card module are independently designed and all modules cooperatively work with one another; each module is a clamping structure and can be disassembled and assembled with bare hands, and the operation and maintenance efficiency is improved; and signal transmission between all modules is completed by means of golden fingers and thereby the internal portion of the case is clean and tidy.

DESCRIPTION OF COMPONENT MARK NUMBERS

Figure 1:
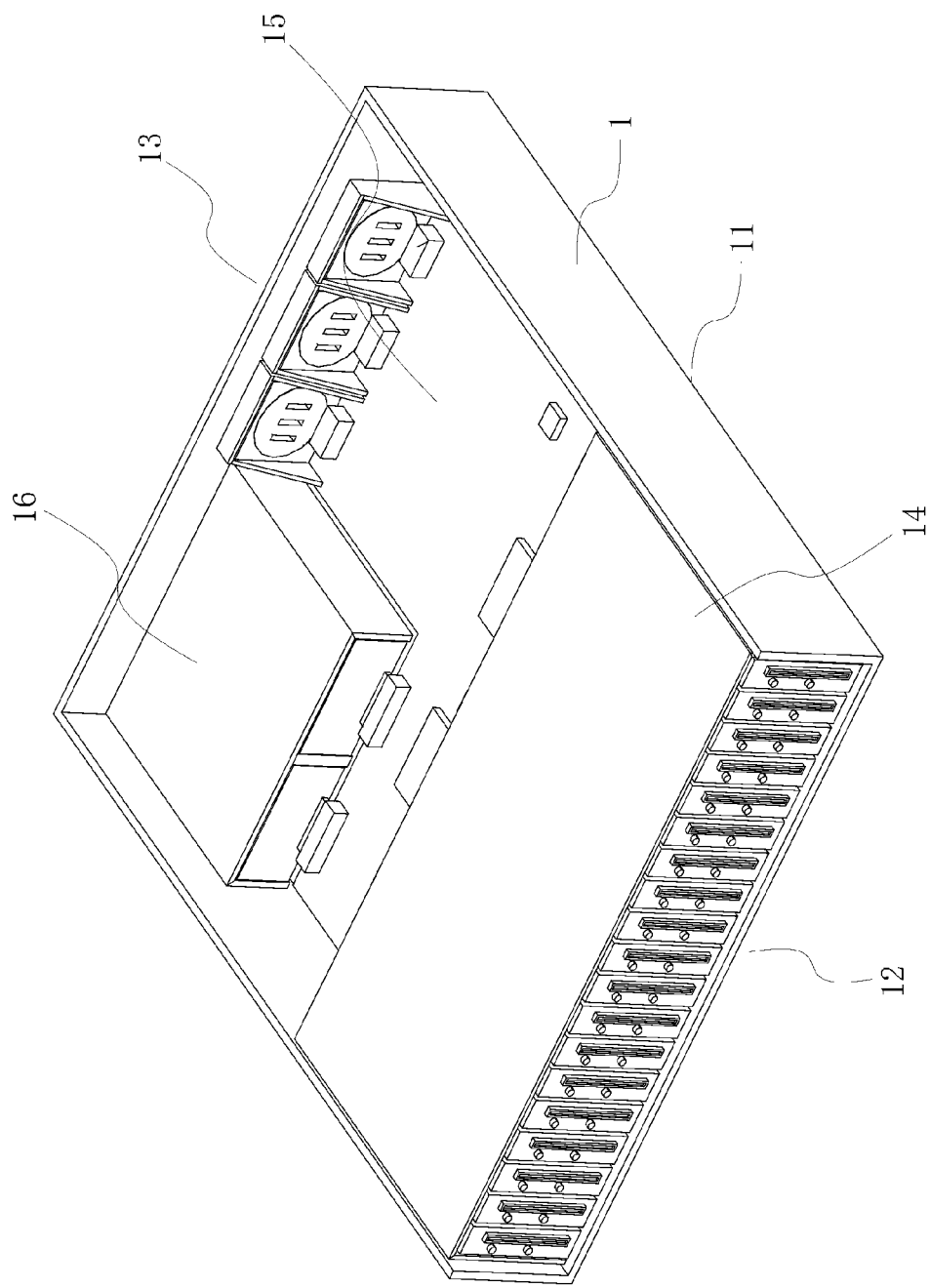
FIG. 1 illustrates a structural schematic diagram of an electronic device of the invention in one embodiment.

1 Case
11 Bottom base

12 First end
13 Second end
14 First accommodating space
15 Second accommodating space
16 Third accommodating space
2 Mainboard
21 Input/output module
22 First plugging portion
23 Second plugging portion
24 Third plugging portion
25 Network switching chip
3 Fan module
31 Fan assembling portion
32 Fan frame
321 Rotating handle
3211 Clamping tongue
4 Power supply module
41 Power supply assembling portion
5 Board card module
51 Board card assembling portion
52 Board card backboard
521 Pluggable connector
53 Baseboard management board card
54 Network node board card
541 Connector
542 Node board card processor chip

DETAILED DESCRIPTION

The implementation mode of the invention will be described below through embodiments. One skilled in the art can easily understand other advantages and effects of the invention according to contents disclosed by the description.

Please refer to FIGS. 1-4. It shall be noted that the structures, scales, sizes and the like drawn in the drawings of the description are only used for cooperating with the contents disclosed by the description to allow one skilled in the art to understand and read instead of limiting the implementable limitation conditions of the invention, and thus have no technical substantive meanings; any structural modifications, changes of scaling relations or adjustments to sizes shall still fall into the range which can be covered by the technical contents disclosed by the invention under the situation that the effects which can be produced by the invention and the purposes which can be achieved by the invention are not influenced. In addition, words such as "above", "below", "left", "right", "middle" and "one" cited in the description are just used for facilitating clear description instead of limiting the implementable range of the invention. Changes or adjustments of relative relations thereof shall also be deemed as the implementable range of the invention under the situation that the technical contents are not substantively changed.

In the actual application of the electronic device provided by the invention, for example, the electronic device is an OTT (Over The Top) high-density server. In this embodiment, the server is the OTT server, the overall size of the electronic device is 450 mm*448 mm*87 mm but not limited thereto, and the electronic device with other sizes is also applicable to the technical solution of the invention. Please refer to FIG. 1, which illustrates an electronic device provided by the invention in one embodiment. The electronic device comprises a case 1, a mainboard 2, at least one fan module 3, at least one power supply module 4 and a board card module 5.

The case 1 comprises two side walls and a bottom base 11 connecting with the two side walls, the case 11 has a first end 12 along a direction of the two side walls and a second end 13 opposite to the first end 12, the case 1 has a first accommodating space 14 close to the first end 12, the case is provided with a second accommodating space 15 and a third accommodating space 16 close to the second end 13. In one embodiment of the invention, the first accommodating space 14 and the third accommodating space 16 are frame structures which are formed on the case 1. In addition, in actual application, the case 1 is provided with a cover plate opposite to the bottom base 11.

Figure 2A:
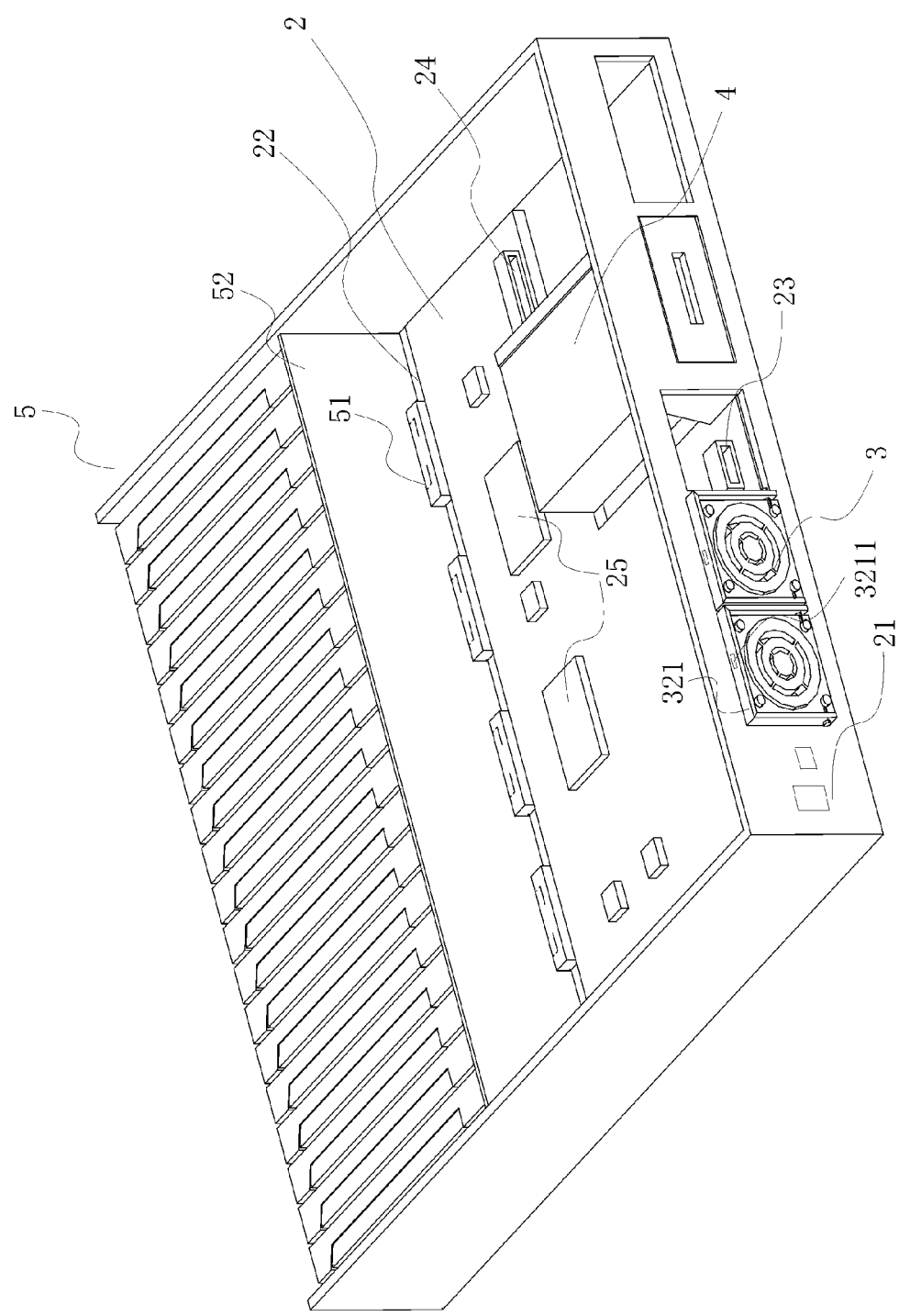
FIG. 2a illustrates a structural schematic diagram of an electronic device of the invention in one embodiment.

In combination with FIG. 2a, the mainboard 2 is fixed on the bottom base 11, is arranged in the second accommodating space 15 and comprises an input/output module 21 for inputting/outputting a signal; the input/output module 21 transmits the signal to an external electronic device by means of the mainboard 2, and the mainboard 2 has a first plugging portion 22 towards the first accommodating space 14, a second plugging portion 23 towards the second end 13 and a third plugging portion 24 towards the third accommodating space 16. In this embodiment, the mainboard 2 is a network switching board and is configured with two network switching chips 25 as shown in FIG. 2a, and the two network switching chips 25 are processor chips which are redundant with each other and can guarantee the network redundancy of the electronic device. The mainboard 2 coordinates and controls the plugging between the first plugging portion 22, the second plugging portion 23 and the third plugging portion 24 and other devices.

Figure 2B:
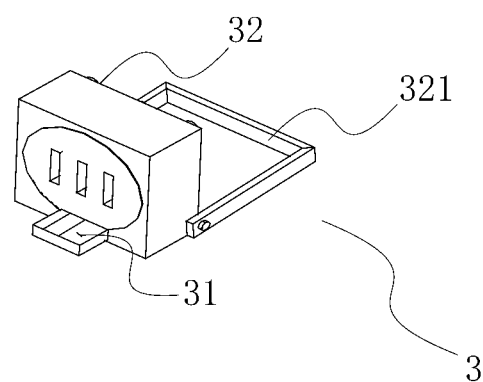
FIG. 2b illustrates a structural schematic diagram of a fan module of the invention in one embodiment.
Figure 2C:
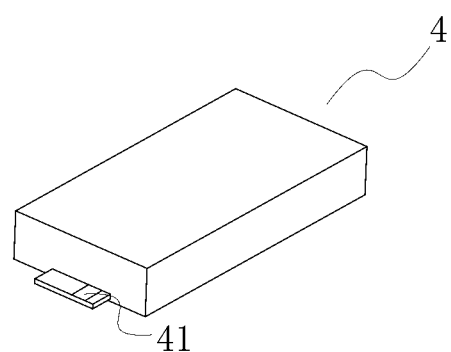
FIG. 2c illustrates a structural schematic diagram of a power supply module of the invention in one embodiment.

The at least one fan module 3 dissipates a heat source of the electronic device, is disposed in the second accommodating space 15, has a fan assembling portion 31 and is electrically connected with the second plugging portion 23 of the mainboard 2 pluggably; and simultaneously referring to FIG. 2b, the fan module 3 also comprises a fan frame 32 and a fan which is arranged in the fan frame 32, and the fan module 3 is clamped with or separated from a clamping holes of the electronic device through a clamping tongue 3211 of a rotating handle 321 on the fan frame 32 to realize plugging between the second plugging portion 23 and the fan assembling portion 31. The fan module 3 is a tool-less structure, so as to avoid the trouble that an operator carries with tools, facilitate the installation and guarantee the tidiness of the internal portion of the case 1. Preferably, in this embodiment, three fan modules 3 are arranged for dissipating heat produced by the electronic device during operation in time to guarantee operation safety.

The at least one power supply module 4 is disposed in the third accommodating space 16, the electronic device has two power supply modules 4 in this embodiment, and one of the two power supply modules 4 is a power supply module which provides redundancy. Simultaneously referring to FIG. 2c, the power supply module 4 has a power supply assembling portion 41 and is electrically connected with the third plugging portion 24 of the mainboard 2 pluggably, wherein the power supply module 4 supplies power of the electronic device. Preferably, the power supply assembling portion 41 and the third plugging portion 24 are respectively a golden finger which is electrically connected with a socket in a matching manner to guarantee the tidiness of devices in the case 1. In this embodiment, the number of the power supply modules 4 is two, the three fan modules 3 and the two power supply modules 4 guarantee that the electronic device can uninterruptedly and continuously operate for a long time.

Figure 3:
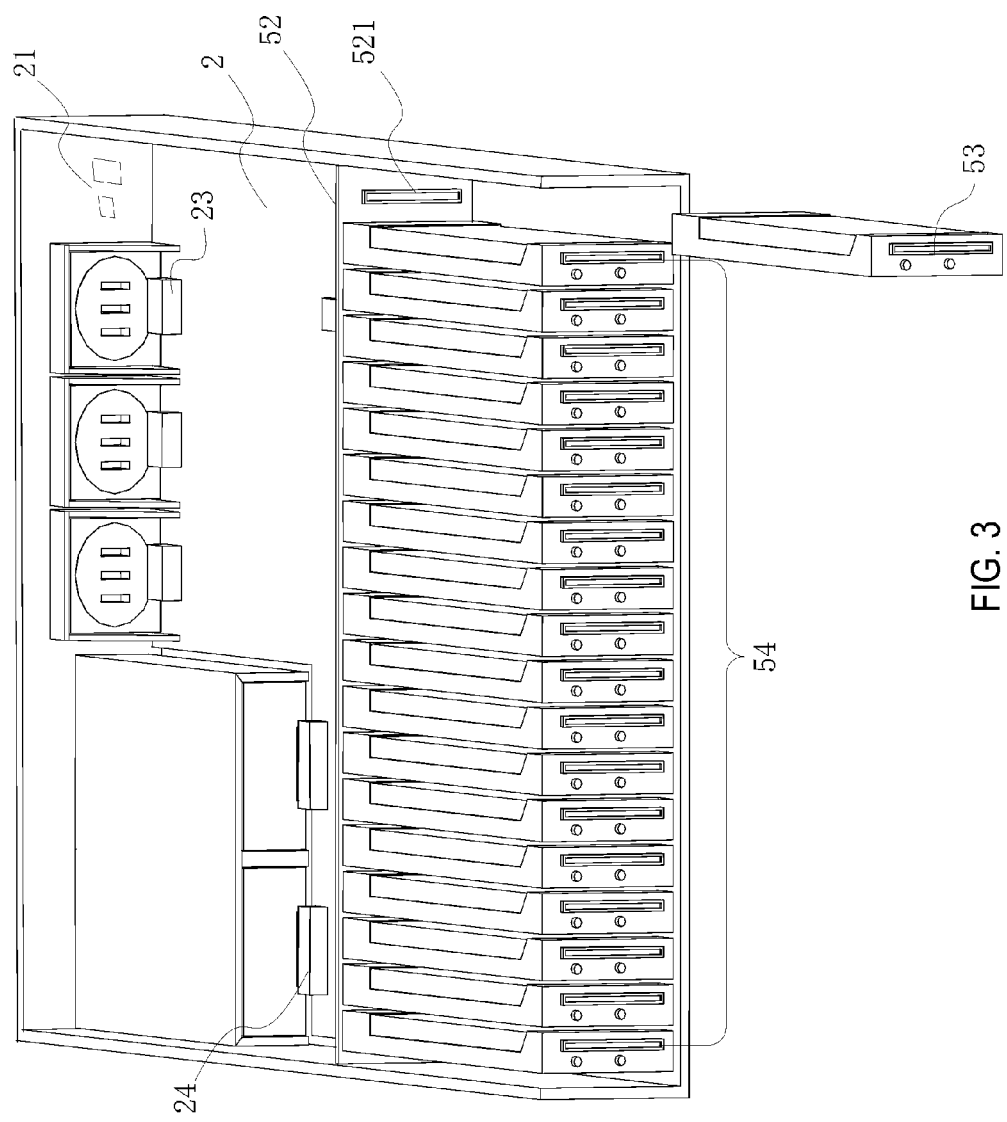
FIG. 3 illustrates a structural schematic diagram of an electronic device of the invention in one embodiment.

Then referring to FIG. 3, the board card module 5 is disposed in the first accommodating space 14, has a board card assembling portion 51 and is electrically connected with the first plugging portion 22 of the mainboard 2 pluggably. The board card module 5 is a tool-less structure, so as to avoid the trouble that an operator carries with tools. Preferably, the board card assembling portion 51 and the first plugging portion 22 are respectively a golden finger which is electrically connected with a socket in a matching manner to guarantee the tidiness of devices in the case 1. In combination with FIG. 2a, the board card assembling portion 51 is a structure having four sockets which are connected with the golden fingers of the first plugging portion. In addition, in one embodiment, an inner end of a top portion of the first accommodating space 14 can be stamped to form a guide rail to match with a top portion of the board card module 5 to form a clamping structure, and the board card module 5 can move along the guide rail; and in another embodiment, the top portion of the board card module 5 can also be provided with a plurality of elastic pieces to enable the elastic pieces to match with the inner end of the top portion of the first accommodating space 14, such that the board card module 5 can be better fixed in the first accommodating space 14. In this embodiment, the board card module 5 further has a board card backboard 52, a baseboard management board card 53 and a plurality of network node board cards 54; the baseboard management board card 53 and the plurality of network node board cards 54 are electrically connected with the mainboard 2 through the board card backboard 52. In order to reinforce the fixation arrangement of the board card backboard 52, the board card backboard 52 can be fixedly connected with a corresponding position of the first accommodating space 14 of the frame structure through a plurality of screws. In addition, referring to FIG. 2a, the portion, towards the second accommodating space 15, of the board card backboard 52 is electrically connected with the first plugging portion 22 of the mainboard 2 through four sockets.

Since the baseboard management board card 53 and the network node board card 54 are very similar in shape, a situation of installation at a wrong position may be caused. Therefore, preferably, a foolproof structural design clamps between the board card module 5 and the first accommodating space 14, such that the space for accommodating the baseboard management board card 53 is only pluggable at a first position; and the space for accommodating the network node board card 54 is only pluggable at a second position, such that working personnel can accurately and quickly install the baseboard management board card 53 and the network node board card 54 at correct positions.

Figure 4:
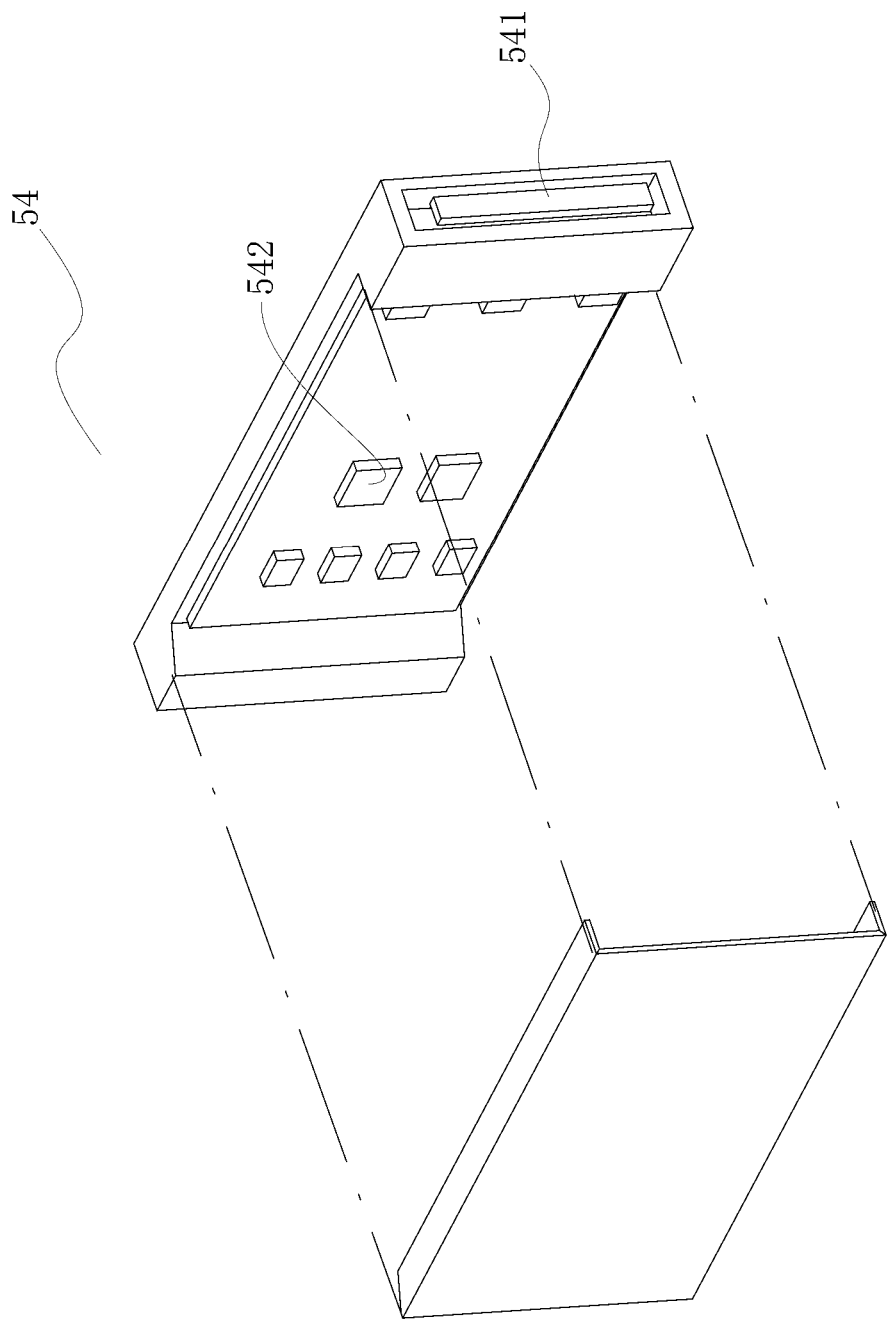
FIG. 4 illustrates a structural schematic diagram of an electronic device of the invention in one embodiment.

Preferably, further in combination with FIG. 4, the baseboard management board card 53 has a connector, each network node board card 54 similar to the baseboard management board card 53 also has a connector 541, pluggable connectors 521 are arranged on the surface, towards the first accommodating space, of the board card backboard 52 and are electrically connected with the connector of the baseboard management board card 53 and the connectors 541 of the network node board cards 54, the number of the pluggable connectors 521 corresponds to the number of the baseboard management board card 53 and the network node board cards 54, and the plugging design enables the layout of the devices in the case 1 to be tidier.

In one embodiment of the invention, the number of the plurality of network node board cards 54 is twenty-four and two node board card processor chips 542 as shown in FIG. 4 are configured on a circuit board of each network node board card 54. Therefore, the entire electronic device can totally carry 48 node board card processor chips 542 and real-time responses can be made to multi-user parallel access requests. In addition, in this embodiment, the network node board cards 54, the baseboard management board card 53 and the fan modules 3 can be freely plugged, and the network node board cards 54 can also support hot plugging.

To sum up, in the electronic device provided by the invention, by reasonably and tidily arranging modules such as the mainboard, the fan module, the power supply module and the board card module in the case, more modules can be arranged in the limited space of the case, the utilization rate is high and the cost is low; the fan module, the power supply module and the board card module are independently designed and all modules cooperatively work with one another; each module is a clamping structure and can be disassembled and assembled with bare hands, and the operation and maintenance efficiency is improved; and signal transmission between all modules is completed by means of golden fingers and thereby the internal portion of the case is clean and tidy. Therefore, the invention effectively overcomes various disadvantages in the prior art and has a great industrial utilization value.

The above-mentioned embodiments are just used for exemplarily describing the principle and effects of the invention instead of limiting the invention. One skilled in the art can make modifications or changes to the above-mentioned embodiments without going against the spirit and the range of the invention. Therefore, all equivalent modifications or changes made by those who have common knowledge in the art without departing from the spirit and technical concept disclosed by the invention shall be still covered by the claims of the invention.

What is claimed is:

1. An electronic device, wherein the electronic device comprises:
    a case, comprising two side walls and a bottom base connecting with the two side walls, the case having a first end extending along a direction extending between and perpendicular to the two side walls and connecting a first end point of each of the two side walls, and a second end opposite to the first end, the second end extending along the direction and connecting a second end point of each of the two side walls, inner space of the case being divided into three accommodating spaces including a first accommodating space bordering the first end and being distanced from the second end, a second accommodating space bordering the second end, and a third accommodating space bordering the second end, the second accommodating space and the third accommodating space being both distanced from the first end and being positioned one after another along the direction, the second accommodating space being between the third accommodating space and one of the two side walls in the direction, the third accommodating space being between the second accommodating space and the other one of the two side walls in the direction;
    a mainboard, fixed on the bottom base, arranged in the second accommodating space and comprising an input/output module for inputting/outputting a signal, the input/output module transmitting the signal to an external electronic device by means of the mainboard, the mainboard having a first plugging portion towards the first accommodating space, a second plugging portion towards the second end and a third plugging portion towards the third accommodating space;
    a board card module, which is disposed in the first accommodating space, has a board card assembling portion and is electrically connected with the first plugging portion of the mainboard in a pluggable manner;

at least one fan module, disposed in the second accommodating space, having a fan assembling portion and electrically connected with the second plugging portion of the mainboard pluggably, wherein the at least one fan module dissipates a heat source of the electronic device; and at least one power supply module, disposed in the third accommodating space, having a power supply assembling portion and electrically connected with the third plugging portion of the mainboard pluggably, wherein the power supply module supplies power of the electronic device.

2. The electronic device according to claim 1, wherein the first plugging portion and the third plugging portion of the mainboard are respectively a golden finger which is electrically connected with a socket in a matching manner.

3. The electronic device according to claim 1, wherein the board card module has a board card backboard, a baseboard management board card and a plurality of network node board cards; the baseboard management board card and the plurality of network node board cards are electrically connected with the mainboard through the board card backboard.

4. The electronic device according to claim 3, wherein the baseboard management board card and the network node board cards respectively have a connector, the board card backboard has a pluggable connector, the connectors are electrically connected with the pluggable connector pluggably.

5. The electronic device according to claim 3, wherein the baseboard management board card and the network node board cards are located at one side of the board card backboard, the baseboard management board card is only pluggable at a first position during arrangement in an accommodating manner, and the network node board cards are only pluggable at a second position during arrangement in an accommodating manner.

6. The electronic device according to claim 3, wherein the plurality of network node board cards comprise twenty-four network node board cards, and two node board card processor chips are configured on a circuit board of each network node board card.

7. The electronic device according to claim 1, wherein the mainboard is a network switching board and is configured with two network switching chips, the two network switching chips are processor chips which are redundant with each other.

8. The electronic device according to claim 1, wherein the fan module comprises a frame and a fan which is arranged in the frame, the fan module is clamped with or separated from a clamping hole of the electronic device through a clamping tongue of a rotating handle to realize plugging between the second plugging portion and the fan assembling portion.

9. The electronic device according to claim 1, further comprising two power supply modules, and one of the two power supply modules is a power supply module which provides redundancy.

10. The electronic device according to claim 1, wherein the first accommodating space and the third accommodating space are frame structures which are formed on the case.

11. The electronic device according to claim 1, wherein the at least on fan module is fixed on the second end.

* * * * *